(12) United States Patent
Den

(10) Patent No.: US 6,720,662 B1
(45) Date of Patent: Apr. 13, 2004

(54) SEMICONDUCTOR DEVICE OF CHIP-ON-CHIP STRUCTURE WITH A RADIATION NOISE SHIELD

(75) Inventor: Keiichi Den, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 184 days.

(21) Appl. No.: 09/702,870

(22) Filed: Nov. 1, 2000

(30) Foreign Application Priority Data

Nov. 4, 1999 (JP) ............................................ 11-314081
Nov. 4, 1999 (JP) ............................................ 11-314083

(51) Int. Cl.$^7$ .............................................. H01L 23/48
(52) U.S. Cl. ...................... 257/777; 257/778; 257/779; 257/780; 257/659; 257/675; 257/676; 257/691
(58) Field of Search ................................ 257/777–780, 257/659, 675–676, 691

(56) References Cited

FOREIGN PATENT DOCUMENTS

| JP | 62-194652 | 8/1987 |
|----|-----------|--------|
| JP | 4-048768 | 2/1992 |
| JP | 5-152508 | 6/1993 |
| JP | 6-005778 | 1/1994 |
| JP | 9-017945 | 1/1997 |
| JP | 2001-077297 | 3/2001 |

*Primary Examiner*—David L. Talbott
*Assistant Examiner*—Luan Thai
(74) *Attorney, Agent, or Firm*—Rabin & Berdo, P.C.

(57) ABSTRACT

A semiconductor device of chip-on-chip structure is provided which includes a first semiconductor chip and a second semiconductor chip bonded onto the first semiconductor chip in stacked relation. In one embodiment, a noise shield film is provided between the first semiconductor chip and the second semiconductor chip for shielding against a radiation noise from the second semiconductor chip. In another embodiment, a metal film is provided between the first semiconductor chip and the second semiconductor chip to provide a heat release path for releasing heat generated by the second semiconductor chip.

19 Claims, 5 Drawing Sheets

SEMICONDUCTOR DEVICE OF CHIP-ON-CHIP STRUCTURE WITH A RADIATION NOISE SHIELD

BACKGROUND OF THE INVENTION

1. Field of the Invention

The present invention relates to a semiconductor device of so-called chip-on-chip structure.

2. Description of Related Art

Semiconductor devices of chip-on-chip structure have been proposed, which include a first semiconductor chip (primary chip) and a second semiconductor chip (secondary chip) bonded onto the first semiconductor chip, for example, with its face down. In this case, electrical connection between the first and second semiconductor chips is achieved by bonding bumps provided on the respective chips in opposed relation. For external connection after the chip-on-chip structure is sealed in a package such as of a resin, wire-bonding between terminals of a lead frame and external connection pads of the first semiconductor chip is performed. The first semiconductor chip is die-bonded to an island of the lead frame.

In the chip-on-chip semiconductor device, the primary chip and the secondary chip are disposed in close proximity to each other. Therefore, a radiation noise from one of the chips may deteriorate the operating characteristics of the other chip.

Where the second semiconductor chip of the chip-on-chip semiconductor device serves as a driver circuit incorporating a bipolar transistor or as a flash memory circuit with high power consumption and with high heat release, the heat dissipation through the lead frame is insufficient. This may deteriorate the operating characteristics of the second semiconductor chip and, in addition, the heat from the second semiconductor chip may adversely affect the first semiconductor chip. Therefore, the semiconductor device may fail to properly maintain its operating characteristics as a whole.

SUMMARY OF THE INVENTION

It is a first object of the present invention to provide an improved semiconductor device of chip-on-chip structure in which a radiation noise generated by one chip is prevented from affecting the other chip.

It is a second object of the invention to provide a semiconductor device of chip-on-chip structure with a consideration for heat dissipation.

A semiconductor device according to a first aspect of the invention comprises a first semiconductor chip, a second semiconductor chip bonded onto the first semiconductor chip in stacked relation, and a noise shield film provided between the first semiconductor chip and the second semiconductor chip for preventing the first and second semiconductor chips from being mutually influenced by noises thereof.

With this arrangement, the noise shield film is provided between the first semiconductor chip and the second semiconductor chip. Therefore, the chip-on-chip semiconductor device can prevent a radiation noise generated by one of the chips from adversely affecting the operating characteristics of the other chip.

The semiconductor device preferably further comprises a connection mechanism which connects the noise shield film to a power supply portion (a power supply line or a ground line). That is, the noise shield film is connected, for example, to a supply potential portion or a ground potential portion of the lead frame via a bonding wire, whereby the noise shield film can assuredly provide a noise shield effect.

The noise shield film is preferably a metal film provided on a surface of the first semiconductor chip and/or the second semiconductor chip, the metal film being formed of the same metal material as bumps which are to be used for bonding the first and second semiconductor chips to each other. In this case, formation of the noise shield film can be achieved simultaneously with formation of the bumps. Since the semiconductor chips typically each have a surface protective film formed on the outermost surface thereof, the noise shield film is preferably provided on the surface protective film.

Where the first semiconductor chip is greater in size than the second semiconductor chip, the noise shield film may be provided at least on the first semiconductor chip for easy connection of the noise shield film to the lead frame or the like.

The noise shield film is preferably provided in a region which covers a major noise source. Where the major noise source is present in the second semiconductor chip and the first semiconductor chip is greater in size than the second semiconductor chip, for example, the noise shield film may include a shield portion which covers an area of the second semiconductor chip where the major noise source is present, and an extension portion extending outwardly from the shield portion on the surface of the first semiconductor chip.

The first and second semiconductor chips may be bonded to each other with active surfaces thereof being opposed to each other.

A semiconductor device according to a second aspect of the invention comprises a first semiconductor chip, a second semiconductor chip bonded onto the first semiconductor chip in stacked relation, a heat conductive member provided between the first semiconductor chip and the second semiconductor chip to define a heat release path for releasing heat generated by the second semiconductor chip, and a connection member thermally connecting the heat conductive member to a heat radiator.

With this arrangement, the heat generated by the second semiconductor chip is transferred to the heat radiator by conduction through the heat conductive member provided between the first and second semiconductor chips and the connection member. The semiconductor device of chip-on-chip structure is thus given a consideration for heat dissipation and, even if the second semiconductor chip generates a great amount of heat, the semiconductor device can properly maintain its operating characteristics as a whole. That is, the heat dissipation from the second semiconductor chip can advantageously be achieved, so that the operating characteristics of the second semiconductor chip can properly be maintained. Further, there is no possibility that the first semiconductor chip is adversely affected by the heat generated by the second semiconductor chip.

The heat radiator maybe a heat sink. In this case, the connection member may be a bonding wire which connects the heat sink to the heat conductive member.

The heat conductive member is preferably composed of a metal (e.g., gold) having a high heat conductivity.

The heat conductive member may be a metal film provided on a surface protective film of at least one of the first semiconductor chip and the second semiconductor chip. Where the first semiconductor chip and the second semiconductor chip are respectively formed with such metal films, the metal films are disposed in contact with each other or bonded to each other, and the metal film provided on the first semiconductor chip is thermally connected to the heat radiator via the connection member such as the bonding wire.

Where the metal film provided on the surface of the first semiconductor chip and/or the second semiconductor chip serves as the heat conductive member, the metal film is preferably formed of the same material (e.g., gold) as bumps which are to be provided on the surface of the first and/or second semiconductor chip. Thus, the metal film can be formed as the heat conductive member on the surface protective film simultaneously with formation of the bumps.

It is preferred that the first semiconductor chip is greater in size than the second semiconductor chip and the metal film has an extension portion which extends from the vicinity of a heat source of the second semiconductor chip to a region of the first semiconductor chip not covered with the second semiconductor chip. In this case, the extension portion of the metal film may thermally be connected to the heat radiator via a bonding wire or the like.

The first semiconductor chip and the second semiconductor chip are preferably bonded to each other with active surfaces thereof being opposed to each other. In this case, the bumps are usually provided on the active surfaces of the first and second semiconductor chips. Therefore, the metal films can be formed on the surfaces of the respective chips in the bump formation process. Thus, the metal films on the respective chips can be brought into contact with each other or bonded to each other when the first and second semiconductor chips are joined together.

The first semiconductor chip is preferably die-bonded to a lead frame. Thus, heat dissipation of the first semiconductor chip can advantageously be achieved through the lead frame.

The foregoing and other objects, features and effects of the present invention will become more apparent from the following description of the preferred embodiments with reference to the attached drawings.

DESCRIPTION OF THE PREFERRED EMBODIMENTS

Figure 1:
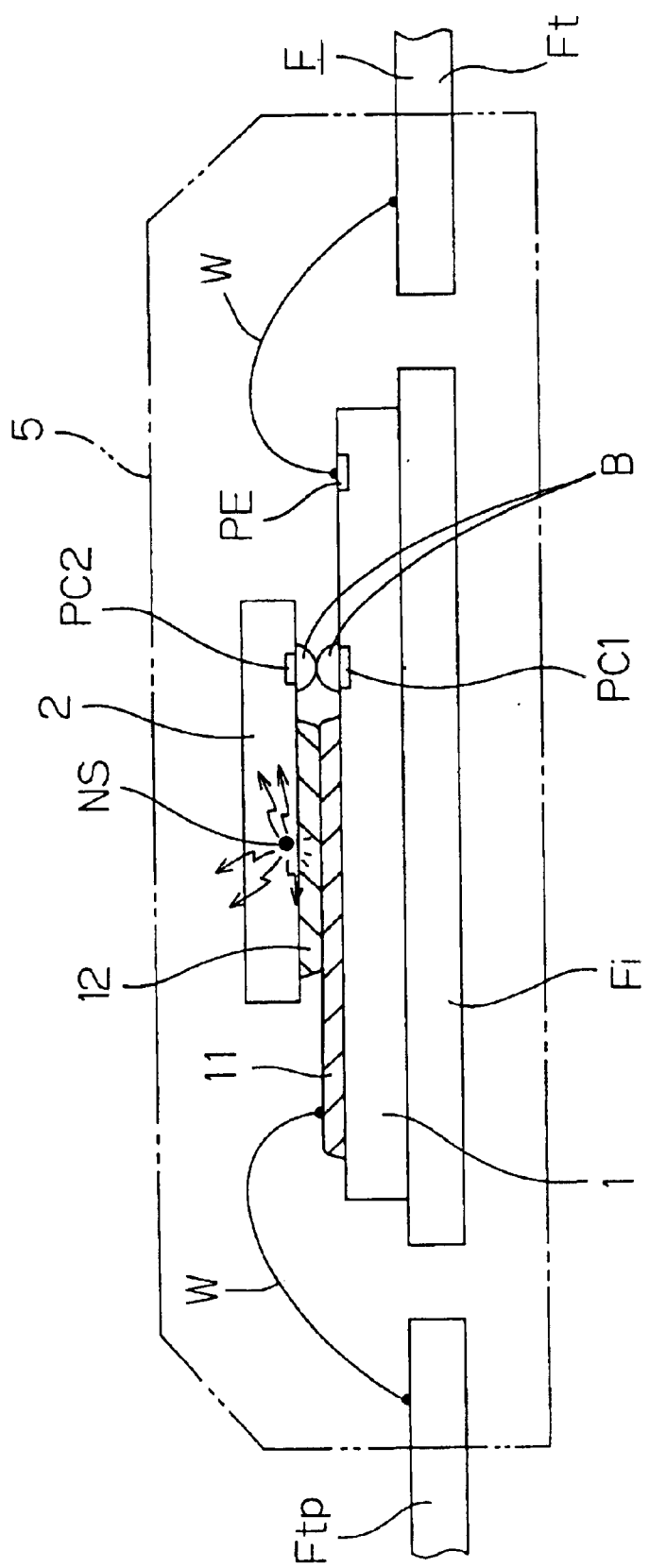
FIG. 1 is a diagrammatic sectional view of a semiconductor device according to a first embodiment of the present invention.
Figure 2:
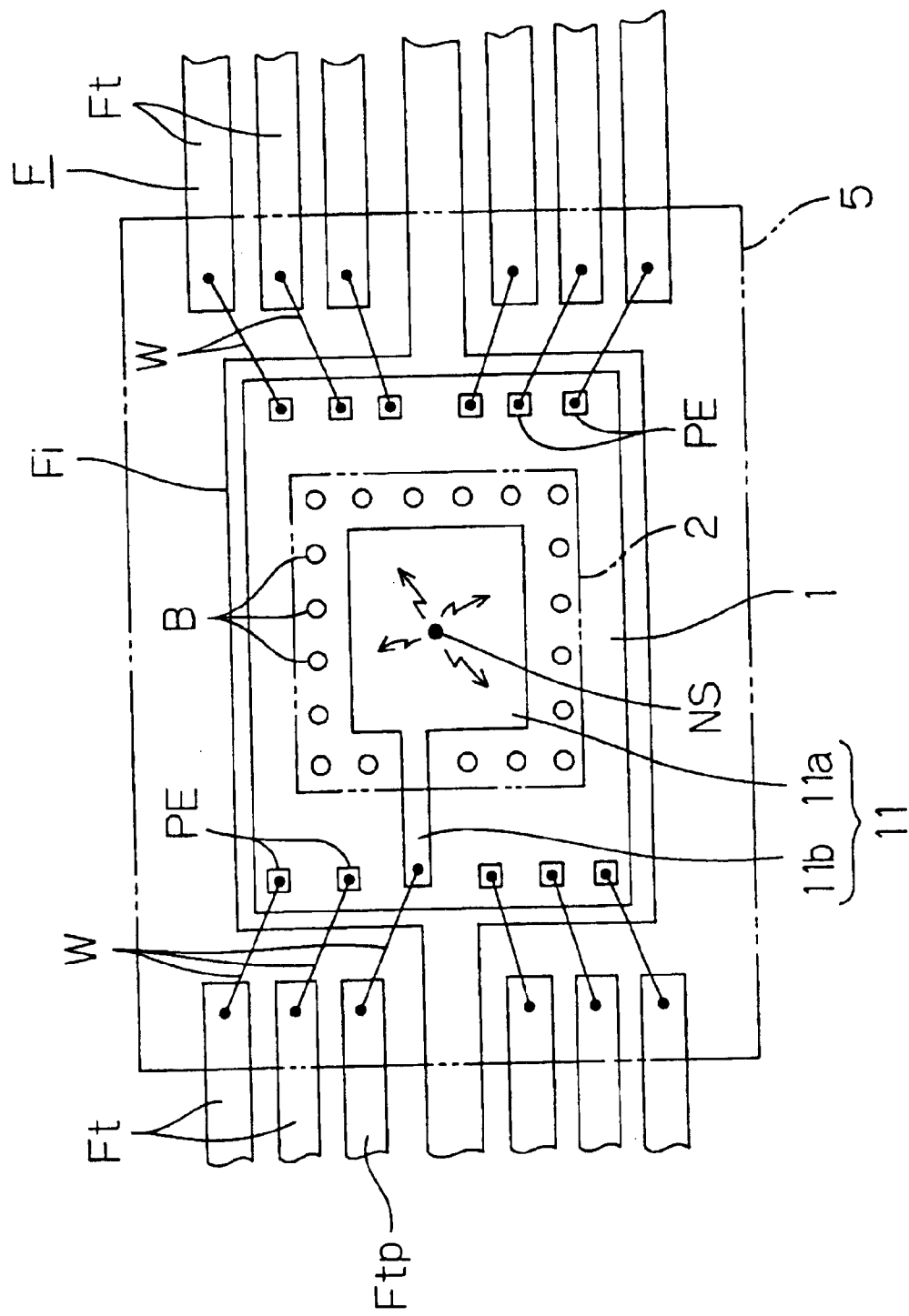
FIG. 2 is a diagrammatic plan view of the semiconductor device of FIG. 1.

FIG. 1 is a diagrammatic sectional view of a semiconductor device according to a first embodiment of the present invention, and FIG. 2 is a diagrammatic plan view of this semiconductor device. The semiconductor device has a chip-on-chip structure, in which a mother chip or primary chip 1 as the first semiconductor chip and a daughter chip or secondary chip 2 (indicated by a two-dot-and-dash line in FIG. 2) as the second semiconductor chip are bonded to each other with active surfaces thereof being opposed to each other. The term "active surface" herein means a surface of a semiconductor chip having an active surface region in which functional elements including an active element such as a transistor or a passive element such as a resistance are provided.

The primary chip 1 and the secondary chip 2 may each be a silicon chip or a semiconductor chip of any other type such as of a germanium semiconductor or a compound semiconductor (gallium arsenide semiconductor, gallium phosphide semiconductor or the like), and are not necessarily required to be semiconductor chips of the same type.

The primary chip 1 and the secondary chip 2 respectively have chip interconnection pads PC1 and PC2 provided on the active surfaces thereof for interconnection therebetween. The primary chip 1 further has external connection pads PE provided on the active surface thereof. Surface protective films (not shown) such as of silicon nitride are respectively provided on the outermost surfaces of the active surfaces of the primary chip 1 and the secondary chip 2, and the pads PC1, PC2, PE are exposed from openings formed in the surface protective films. Electrical and mechanical connection between the primary chip 1 and the secondary chip 2 is achieved by utilizing bumps B provided on both or either of the chip interconnection pads PC1 and PC2 of the primary chip 1 and the secondary chip 2.

The external connection pads PE of the primary chip 1 are respectively connected to terminals Ft of a lead frame F via bonding wires W. The lead frame F includes an island Fi to which a semiconductor chip is die-bonded, and the terminals Ft for connection to the inside and outside of a package of the semiconductor device. The primary chip 1 is die-bonded to the island Fi.

Noise shield films 11 and 12 are provided on the active surfaces of the primary chip 1 and the secondary chip 2, respectively, for shielding against a noise generated by the secondary chip 2. More specifically, the noise shield film 12 (not shown in FIG. 2), which is a metal film such as of gold, is provided on the secondary chip 2 to cover a portion of the outermost surface of the secondary chip 2 adjacent to a noise source NS such as a bipolar transistor provided in the secondary chip 2. The noise shield film 11, which is a metal film such as of gold, is provided on the primary chip 1 to be brought into contact with or bonded to the noise shield film 12 provided on the surface of the secondary chip 2. These noise shield films 11, 12 are preferably formed of the same material as the bumps B. In this case, the formation of the noise shield films 11, 12 can be achieved simultaneously with the formation of the bumps B.

The primary chip 1 has a greater size than the secondary chip 2 as viewed in plan. The noise shield film 11 includes a shield portion 11a provided in an area where the noise source NS is present, and an extension portion 11b extending outwardly from the shield portion 11a to a region of the primary chip not covered with the secondary chip 2. The extension portion 11b is connected via a bonding wire W to a power supply terminal Ftp (one of the terminals Ft of the lead frame F) to which a supply potential or a ground potential is applied.

When the semiconductor device is to be assembled, the primary chip 1 and the secondary chip 2 are bonded to each other via the bumps B, and the noise shield films 11 and 12 are brought into contact with each other. Then, the primary chip 1 is die-bonded to the island Fi. Further, the primary chip 1 is wire-bonded to the terminals Ft, and the noise shield film 11 is wire-bonded to the power supply terminal Ftp. Thereafter, the chip-on-chip structure including the primary chip 1 and the secondary chip 2 is sealed in a package 5 with the use of a proper resin. At this time, the island Fi, parts of the terminals Ft and the bonding wires W are sealed in the package 5.

In the semiconductor device of this embodiment having the aforesaid structure, the noise shield film 11, 12 shield the primary chip 1 from a radiation noise from the noise source NS of the secondary chip 2, so that the radiation noise does not reach the primary chip 1. Therefore, the primary chip 1 is prevented from being affected by the radiation noise from the secondary chip 2 thereby to be free from deterioration in operating characteristics. At the same time, the secondary chip 2 is prevented from being affected by a radiation noise from the primary chip 1, so that the secondary chip 2 can properly maintain its characteristics for proper operation.

In the aforesaid embodiment, the noise shield films 11 and 12, which are provided on the active surfaces of the primary chip 1 and the secondary chip 2, respectively, are disposed in contact with each other or bonded to each other. Alternatively, the provision of the noise shield film 12 on the secondary chip 2 may be obviated with only the noise shield film 11 provided on the primary chip 1. In such a case, the same effect can be achieved.

Further, only the noise shield film 12 may be provided on the secondary chip 2, and connected to a bump B to which a supply potential or a ground potential is to be applied.

Figure 3:
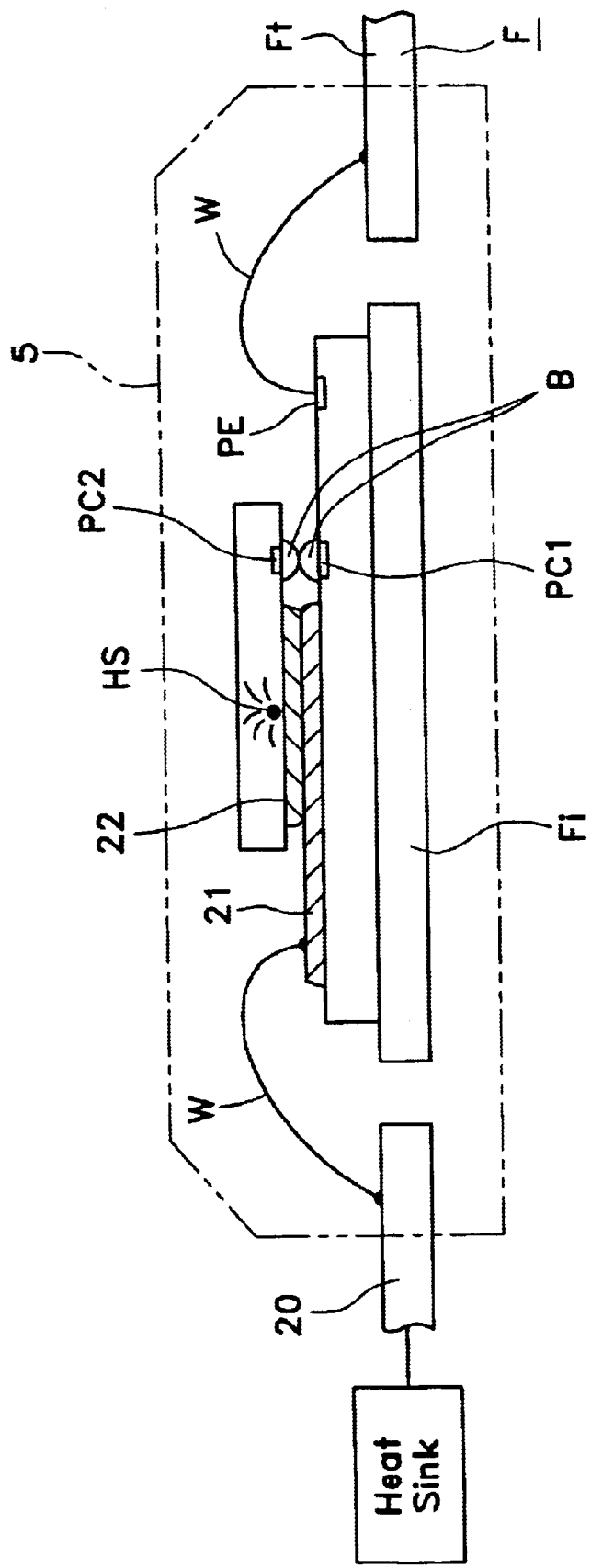
FIG. 3 is a diagrammatic sectional view of a semiconductor device according to a second embodiment of the invention.
Figure 4:
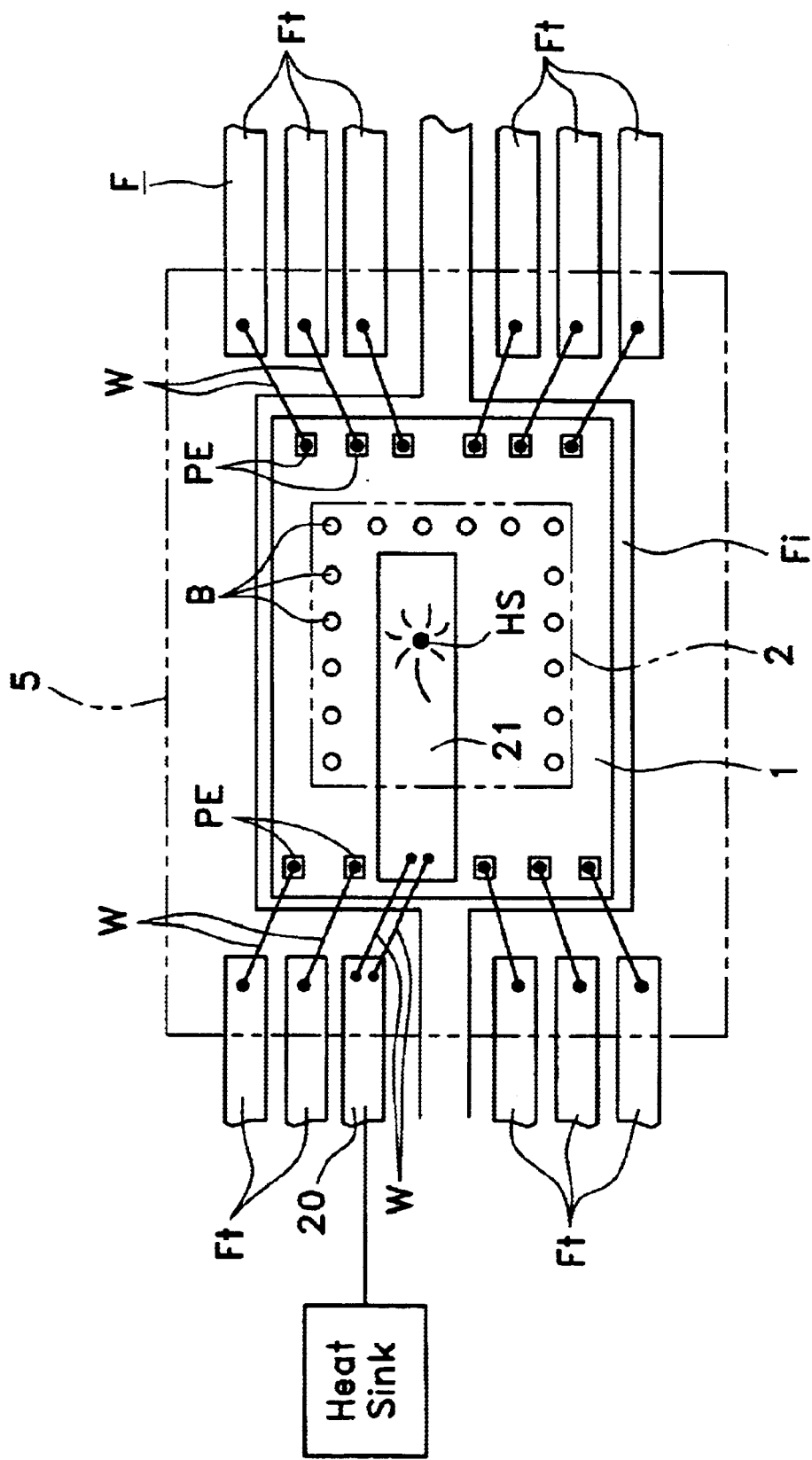
FIG. 4 is a diagrammatic plan view of the semiconductor device of FIG. 3.

FIG. 3 is a diagrammatic sectional view of a semiconductor device according to a second embodiment of the invention, and FIG. 4 is a diagrammatic plan view of this semiconductor device. The semiconductor device of this embodiment has substantially the same construction as the semiconductor device of the first embodiment. In FIGS. 3 and 4, therefore, components equivalent to those shown in FIGS. 1 or 2 are denoted by the same reference characters as in FIGS. 1 or 2.

In the semiconductor device of the second embodiment, metal films 21, 22 which define a heat release path for releasing heat generated by the secondary chip 2 are provided on the active surfaces of the primary chip 1 and the secondary chip 2, respectively. More specifically, the metal film 22 (not shown in FIG. 2), which is formed of gold or the like, is provided on the secondary chip 2 to cover a region of the outermost surface of the secondary chip 2 adjacent to a heat source HS such as a bipolar transistor provided in the secondary chip 2. The metal film 21, which is formed of gold or the like, is provided on the primary chip 1 so as to be brought into contact with or bonded to the metal film 22 provided on the surface of the secondary chip 2. These metal films 21, 22 are preferably formed of the same material as the bumps B. In such a case, the formation of the metal films 21, 22 can be achieved simultaneously with the formation of the bumps B.

The primary chip 1 is die-bonded to the island Fi, so that heat generated by the primary chip 1 is released to the outside through the lead frame F.

The primary chip 1 has a greater size than the secondary chip 2 as viewed in plan. The metal film 21 extends from a region of the primary chip 1 where it is kept in contact with or bonded to the metal film 22 to a region of the primary chip 1 not covered with the secondary chip 2. The metal film 21 is thermally connected to a connection portion 20 of a heat sink (heat radiator) via one or plural bonding wires W.

When the semiconductor device is to be assembled, the primary chip 1 and the secondary chip 2 are bonded to each other via bumps B, and the metal films 21, 22 are brought into contact with each other. Then, the primary chip 1 is die-bonded to the island Fi. Further, the primary chip 1 is wire-bonded to the terminals Ft, and the metal film 21 is wire-bonded to the connection portion 20 of the heat sink. Thereafter, the chip-on-chip structure including the primary chip 1 and the secondary chip 2 is sealed in a package 5 with the use of a proper resin. At this time, the island Fi, parts of the terminals Ft, the connection portion 20 of the heat sink and the bonding wires W are sealed in the package 5.

In this embodiment, the heat generated by the heat source HS in the secondary chip 2 is transferred to the connection portion 20 of the heat sink by conduction through the metal films 21, 22 and the bonding wires W thereby to be released from a main body of the heat sink outside the package 5. Where the secondary chip 2 serves as a driver circuit incorporating a bipolar transistor or a flash memory circuit with high heat release, the heat can advantageously be dissipated, so that the temperature rise of the secondary chip 2 and the primary chip 1 bonded thereto can be suppressed. This ensures proper operation of the primary chip 1 and the secondary chip 2, thereby improving the reliability of the semiconductor device.

Figure 5:
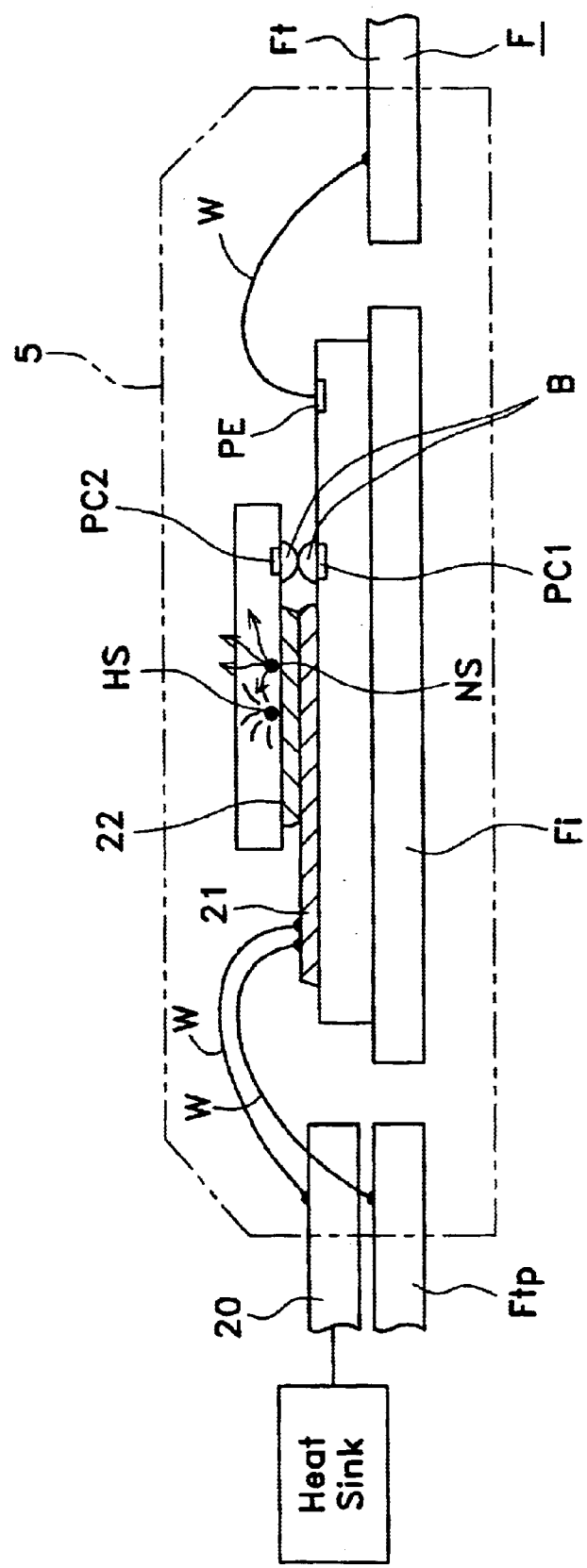
FIG. 5 is a diagrammatic sectional view of a semiconductor device according to a third embodiment of the invention.

FIG. 5 is a diagrammatic sectional view for explaining the structure of a semiconductor device according to a third embodiment of the invention. In FIG. 5, components corresponding to those shown in FIG. 3 are denoted by the same reference characters as in FIG. 3.

In this embodiment, the secondary chip 2 includes a heat source HS and a noise source NS. Metal films 21, 22 are provided on the primary chip 1 and the secondary chip 1, respectively, to cover a region of the secondary chip in which both the heat source HS and the noise source NS are present. That is, the metal films 21, 22 cover the same region as covered by the metal films 11, 12 in FIGS. 1 and 2.

An extension portion of the metal film 21 on the primary chip 1 is connected to the connection portion 20 of the heat sink, and electrically connected to the power supply terminal Ftp (one of the terminals Ft of the lead flame F) to which a supply potential or a ground potential is applied. Although the connection portion 20 of the heat sink and the power supply terminal Ftp are shown at different height levels in FIG. 5 for convenience of diagrammatic expression, they are preferably located in a plane in which the terminals Ft of the lead frame F are located.

With this arrangement, the metal films 21, 22 define a heat release path for heat dissipation from the heat source HS, and also functions as noise shield films. The chip-on-chip semiconductor device is thus given a consideration for the heat dissipation and for the noise shield.

In the second and third embodiments, the metal films 21, 22, which are provided on the active surfaces of the primary chip 1 and the secondary chip 2, respectively, are disposed in contact with each other or bonded to each other. Alternatively, only the primary chip 1 may be formed with the metal film 21, which is brought into contact with a surface portion of the secondary chip 2 adjacent to the heat source.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Applications No. 11-314081 and No. 11-314083 filed to the Japanese Patent Office on Nov. 4, 1999, the disclosure thereof being incorporated herein by reference.

What is claimed is:

1. A semiconductor device comprising:
   a first semiconductor chip;
   a second semiconductor chip bonded onto the first semiconductor chip in stacked relation;
   a noise shield film provided between the first semiconductor chip and the second semiconductor chip for preventing the first and second semiconductor chips from being mutually influenced by noises thereof,
   a connection mechanism which connects the noise shield film to a power supply portion, and
   a lead frame,
   wherein the first semiconductor chip is greater in size than the second semiconductor chip, and the noise shield film is provided on a surface of at least the first semiconductor chip,
   wherein a major noise source is present in the second semiconductor chip,
   wherein the noise shield film includes a shield portion which covers an area in which the major noise source is present, and an extension portion extending outwardly from the shield portion on a surface of the first semiconductor chip and beyond an edge of the second semiconductor chip,
   wherein the connection mechanism includes a bonding wire which directly connects the noise shield film to a portion of the lead frame which has a supply potential or a ground potential.

2. A semiconductor device as set forth in claim 1, further comprising an electrode portion provided between the first semiconductor chip and the second semiconductor chip for electrical connection between the first and second semiconductor chips, wherein the noise shield film is composed of the same material as the electrode portion.

3. A semiconductor device as set forth in claim 2, wherein the electrode portion includes a bump which serves for electrical and mechanical connection between the first and second semiconductor chips.

4. A semiconductor device as set forth in claim 1, wherein the noise shield film is provided in a region which covers a major noise source.

5. A semiconductor device as set forth in claim 1, wherein the first and second semiconductor chips are bonded to each other with active surfaces thereof being opposed to each other.

6. A semiconductor device as set forth in claim 1, wherein the noise shield film includes a metal film provided on a surface of at least one of the first semiconductor chip and the second semiconductor chip.

7. A semiconductor device comprising:
   a first semiconductor chip;
   a second semiconductor chip bonded onto the first semiconductor chip in stacked relation;
   a heat conductive member provided between the first semiconductor chip and the second semiconductor chip to define a heat release path for releasing heat generated by the second semiconductor chip; and
   a connection member thermally connecting the heat conductive member to a heat radiator, the heat radiator including a heat sink wherein the connection member includes a bonding wire which directly connects the heat conductive member to the heat sink.

8. A semiconductor device as set forth in claim 7, wherein the heat conductive member includes a metal film provided on a surface of at least one of the first semiconductor chip and the second semiconductor chip.

9. A semiconductor device as set forth in claim 7, further comprising an electrode portion provided between the first semiconductor chip and the second semiconductor chip for electrical connection between the first and second semiconductor chips, wherein the heat conductive member is composed of the same metal material as the electrode portion.

10. A semiconductor device as set forth in claim 9, wherein the electrode portion includes a bump which serves for electrical and mechanical connection between the first semiconductor chip and the second semiconductor chip.

11. A semiconductor device as set forth in claim 7, further comprising a lead frame,
    wherein the first semiconductor chip is die-bonded to the lead frame.

12. A semiconductor device as set forth in claim 7, wherein the first and second semiconductor chips are bonded to each other with active surfaces thereof being opposed to each other.

13. A semiconductor device comprising:
    a first semiconductor chip;
    a second semiconductor chip bonded onto the first semiconductor chip in stacked relation;
    a heat conductive member provided between the first semiconductor chip and the second semiconductor chip to define a heat release path for releasing heat generated by the second semiconductor chip; and
    a connection member thermally connecting the heat conductive member to a heat radiator, wherein the heat conductive member includes a first metal film provided on a surface of the first semiconductor chip and a second metal film provided on the surface of the second semiconductor chip, the first metal film and the second metal film are either in direct contact with each other or directly bonded to each other,
    wherein a major heat source is present in the second semiconductor chip,
    wherein the first semiconductor chip is greater in size than the second semiconductor chip,
    wherein the metal film has an extension portion which extends from the vicinity of the major heat source to a surface portion of the first semiconductor chip not covered with the second semiconductor chip, and the extension portion of the metal film is thermally connected to the heat radiator via the connection member and extends beyond an edge of the second semiconductor chip.

14. A semiconductor device as set forth in claim 13, wherein the heat radiator includes a heat sink.

15. A semiconductor device comprising:
    a first semiconductor chip;
    a second semiconductor chip bonded onto the first semiconductor chip in stacked relation;
    a heat conductive member provided between the first semiconductor chip and the second semiconductor chip to define a heat release path for releasing heat generated by the second semiconductor chip; and
    a connection member thermally connecting the heat conductive member to a heat radiator,
    wherein the heat conductive member includes a first metal film provided on a surface of the first semiconductor chip and a second metal film provided on a surface of the second semiconductor chip, and the first metal film and the second metal film either are disposed in direct contact with each other or are directly bonded to each other, wherein the first metal film is thermally connected to the heat radiator via the connection member.

16. A semiconductor device comprising:

a first semiconductor chip;

a second semiconductor chip bonded onto the first semiconductor chip in stacked relation; and wherein the first semiconductor chip is greater in size than the second semiconductor chip, and includes a first metal film provided on a surface of the first semiconductor chip, the second semiconductor chip includes a second metal film provided on a surface thereof and the first metal film and the second metal film are either in direct contact with each other or directly bonded to each other, wherein a major noise source is present in the second semiconductor chip, wherein the metal film includes a shield portion which covers an area in which the major noise source is present, and an extension portion extending outwardly from the shield portion on a surface of the first semiconductor chip and beyond an edge of the second semiconductor chip wherein the metal film is provided in a region which covers the major noise source within the second semiconductor chip.

17. A semiconductor device comprising:

a first semiconductor chip;

a second semiconductor chip bonded onto the first semiconductor chip in stacked relation;

a metal film provided between the first semiconductor chip and the second semiconductor chip;

a connection member thermally connecting the metal film to a heat radiator including a heat sink; and, a bonding wire directly bonded to the connection member and connecting the metal film to the heat sink, wherein the metal film provides a heat release path for releasing heat from a major heat source within the second semiconductor chip.

18. A semiconductor device comprising:

a first semiconductor chip;

a second semiconductor chip bonded onto the first semiconductor chip in stacked relation;

a metal film provided between the first semiconductor chip and the second semiconductor chip, the metal film being provided on a surface of at least one of the first semiconductor chip and the second semiconductor chip;

a connection member thermally connecting the metal film to a heat radiator; and a bonding wire directly bonded to the connection member and connecting the metal film to the heat radiator, wherein the first semiconductor chip is greater in size than the second semiconductor chip, wherein the metal film has an extension portion which extends to a surface portion of the first semiconductor chip not covered with the second semiconductor chip, and the extension portion of the metal film extends beyond an edge of the second semiconductor chip, wherein the metal film is provided in a region which covers a major noise source within the second semiconductor chip, and also provides a heat release path for releasing heat from the major heat source with in the second semiconductor chip.

19. A semiconductor device comprising:

a first semiconductor chip;

a second semiconductor chip bonded onto the first semiconductor chip in stacked relation;

a metal film provided between the first semiconductor chip and the second semiconductor chip to define a heat release path for releasing heat generated by the second semiconductor chip;

a connection member thermally connecting the metal film to a heat radiator; and an electrode portion, wherein the metal film includes a first metal film portion provided on a surface of the first semiconductor chip and a second metal film portion provided on a surface of the second semiconductor chip, and the first metal film portion and the second metal film portion are disposed in direct contact with each other or directly bonded to each other, wherein the first metal film portion is thermally connected to the heat radiator via the connection member, wherein the electrode portion is provided between the first semiconductor chip and the second semiconductor chip for electrical connection between the first and second semiconductor chips, wherein the metal film is composed of the same metal material as the electrode portion.

* * * * *